United States Patent [19]

Kumasaka et al.

[11] Patent Number: 5,276,724
[45] Date of Patent: Jan. 4, 1994

[54] X-RAY EXPOSURE APPARATUS

[75] Inventors: Fumiaki Kumasaka; Yoshimi Yamashita; Kei Horiuchi; Yasuo Nara, all of Kawasaki, Japan

[73] Assignee: Fujitsu Limited, Kawasaki, Japan

[21] Appl. No.: 945,047

[22] Filed: Sep. 15, 1992

[30] Foreign Application Priority Data

Sep. 20, 1991 [JP] Japan .................. 3-242047

[51] Int. Cl.[5] .................................. G21K 1/00
[52] U.S. Cl. ........................... 378/34; 378/161
[58] Field of Search ............ 378/34, 145, 149, 154, 378/161

[56] References Cited

U.S. PATENT DOCUMENTS 4,484,339 11/1984 Mallozzi et al. .................. 378/34

Primary Examiner—David P. Porta
Attorney, Agent, or Firm—Nikaido, Marmelstein, Murray & Oram

[57] ABSTRACT

Several ten thousands or several millions of juxtaposed hollow thin tubes, each having a diameter of, for example, 12 μm and a length of 1 mm, are joined to each other to form a window having a predetermined open surface area. The window having a diameter of, for example, 30 mm, can withstand a differential pressure of several atm. A high-vacuum X-ray source and the window consisting of thin tubes having the aforementioned dimensions are connected through a differential evacuating device having a plurality of stages connected with a partitioning wall having an orifice of predetermined dimensions provided between the adjacent stages. The pressures at the two sides of the window are maintained to the atmospheric pressure and a pressure which is 1/10th of the atmospheric pressure, respectively. X-rays having a long wavelength of 10 Å or above and emitted by a SOR device under a high vacuum can be illuminated on a sample provided in an environment at the atmospheric pressure at a high transmittance and over a wide area which cannot be achieved by a conventional Be window.

5 Claims, 4 Drawing Sheets

X-RAY EXPOSURE APPARATUS

BACKGROUND OF THE INVENTION

1. Field of the Invention

The present invention relates to an apparatus for exposing a substrate like a semiconductor wafer to X-rays in the lithographic process in the manufacture of semiconductor devices, and more particularly, to an X-ray transmitting window which forms a partitioning wall of two vessels having a relative pressure difference and which transmits X-rays so as to allow X-rays to be transferred between the vessels.

2. Description of the Related Art

There is an increasing demand for fine circuit patterns in order to provide high-density and high-performance semiconductor integrated circuits. The possibility of formation of fine patterns on the order of 0.1 μm or less is the primary reason for developing X-ray lithography. A promising high-output X-ray source employed in such an X-ray lithography is SOR (synchrotron orbital radiation). In X-ray lithography which employs SOR, X-rays generated under a high vacuum of about $10^{-10}$ Torr are irradiated onto a sample, such as a semiconductor wafer, generally placed in an atmosphere having 1 atm. To achieve this, an X-ray transmitting window made of a material having a high X-ray transmittance, such as beryllium (Be), is provided between the SOR source and the sample chamber.

For the reason mentioned above, a pressure difference substantially equal to 1 atm is applied to the X-ray transmitting window. In the case of an X-ray transmitting window made of a Be plate and having an opening area of, for example, 30 mm × 30 mm, such a pressure difference can be resisted if the thickness is about 0.2 mm. However, such a Be X-ray transmitting window has the following drawbacks.

(1) 10 Å X-rays which pass through Be are attenuated at about 0.2 dB/μm. This attenuation rate increases as the wavelength increases. Thus, the use of X-rays of short wavelengths in x-ray lithography is advantageous from the viewpoint of transmittance. However, X-ray absorber (which may be a gold film) on the exposure mask readily transmits X-rays of short wavelengths. Consequently, in X-ray lithography, the contrast of the X-ray absorber patterns is reduced, making exposure of fine patterns difficult. Thus, the use of a Be X-ray transmitting window which is as thin as possible and of X-rays of long wavelengths is desired. To achieve these objectives, it is necessary for the thickness of the Be X-ray transmitting window to be reduced to 1/10th or less of that of the conventional window.

(2) To achieve a high throughput in X-ray lithography, it is desired to increase the opening area of the X-ray transmitting window to about several tens of millimeters x several tens of millimeters.

Currently, it is very difficult to provide a Be X-ray transmitting window which satisfies the aforementioned requirements.

SUMMARY OF THE INVENTION

An object of the present invention is to provide an X-ray transmitting window which exhibits a high transmittance to X-rays having long wavelengths of 10 Å or above, which has an opening area whose side dimension is several tens of millimeters, and which can withstand a pressure difference of about 1 atm.

Another object of the present invention is to provide an X-ray exposure apparatus having two vessels which are connected to each other through the partitioning wall formed of the abovementioned window, so that, in a source connected to one of the vessels, an SOR is generated, and in another vessel, a sample like a silicon wafer coated with a resist film is exposed to an X-ray of the SOR transmitted through the window.

To achieve the above object, an X-ray transmitting window according to the present invention is a plate-like member formed by joining a large number of juxtaposed capillary tubes, each having an inner diameter of about several tens of μm, parallel to each other. The smaller the inner diameter of each of the capillary tubes and the larger the length thereof, the greater the pressure difference obtained at the two sides of the window. That is, it is possible to produce a vacuum at one side of the window and an atmospheric pressure at the other side thereof. However, a decrease in the inner diameter of the thin tubes and an increase in the length thereof reduces the transmittance of the window. Thus, the inner diameter and length (the thickness of the window) of the capillary tubes are determined with the practical pressure difference and transmittance taken into consideration. The size of the window is determined such that the window withstands that pressure difference.

DESCRIPTION OF THE PREFERRED EMBODIMENTS

Figure 1A:
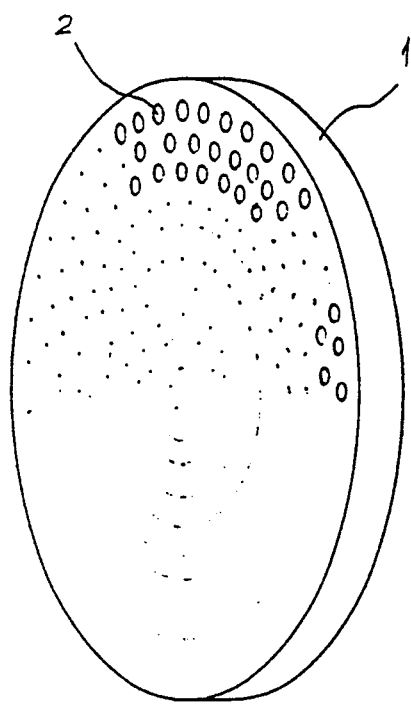
FIG. 1(a) is a perspective view of an X-ray transmitting window according to the present invention.
Figure 1B:
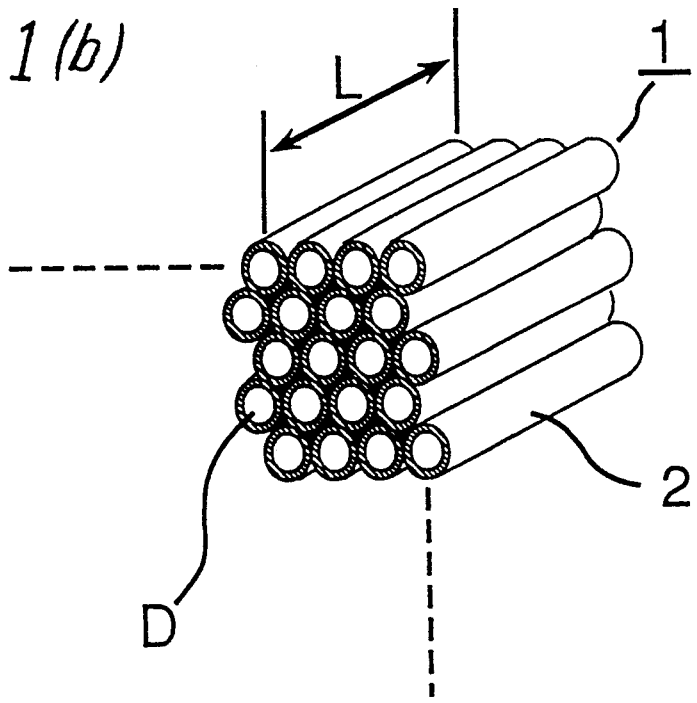
FIG. 1(b) is an enlarged perspective view of part of the X-ray transmitting window of FIG. 1(a)

FIG. 1(a) illustrates the structure of an X-ray transmitting window according to the present invention. FIG. 1(b) is an enlarged perspective view of part of the X-ray transmitting window. An X-ray transmitting window 1 is a thin tube bundle in which a plurality of juxtaposed thin tubes, each having a predetermined inner diameter (D) and a length (L), are joined parallel to each other. Such an X-ray transmitting window 1 is manufactured in the manner described below: first, the surface of each of wire like members having a predetermined diameter and made of a first material removable by etching is coated by a layer made of a second material that cannot be removed by etching. The plurality of wire-like members coated by the second material are bundled parallel to each other and then processed in the form of a plate-like member having a predetermined thickness. The wire-like members in that plate-like member are selectively removed by etching to obtain the X-ray transmitting window. The plate-like member has a pair of surfaces parallel to each other and ends of the tubes each consisting of the layer of the second material respectively open on the surfaces providing an open surface area. Such a plate-like member consisting of a bundle of thin tubes is available on the market as the secondary electron amplifying member (for example, capillary-plate manufactured by Hamamatsu Photonics K.K., Japan). In the present invention, the aforementioned capillary plate is used as the X-ray transmitting window, and the conductance, transmittance and mechanical strength thereof are evaluated.

Figure 2A:
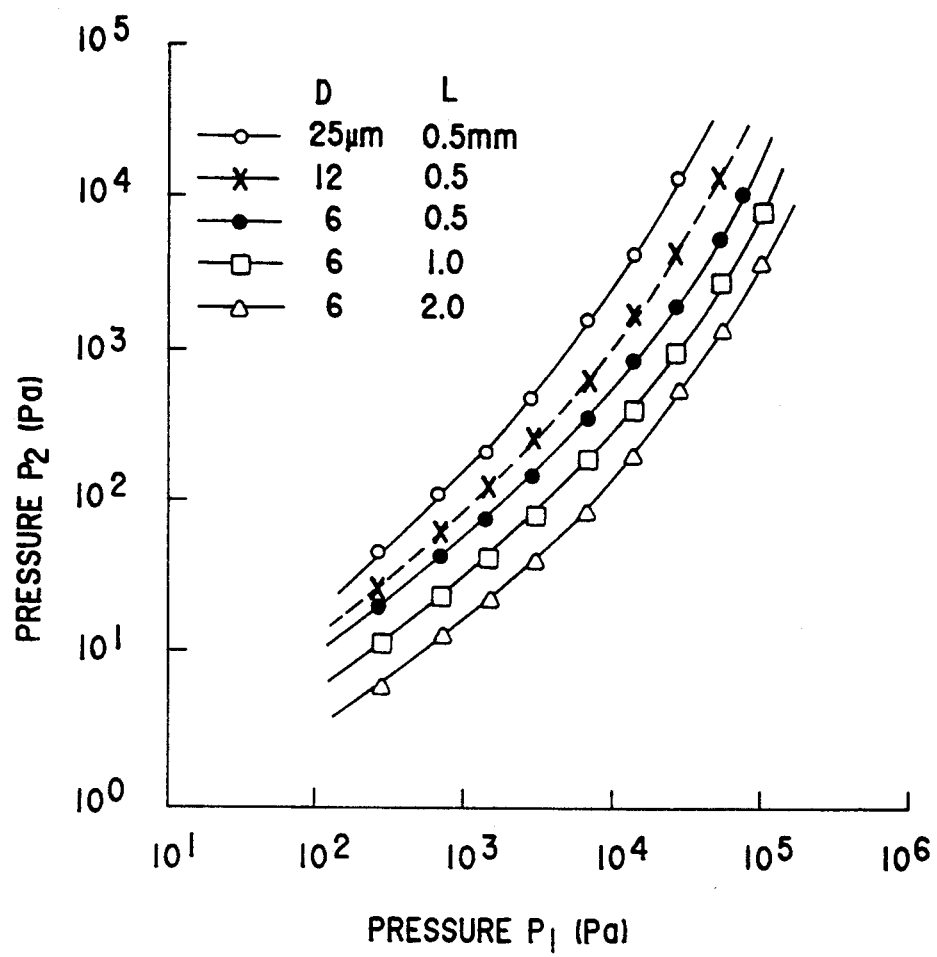
FIG. 2(a) is a graph showing the results of the experiments conducted on the differential pressure achieved by the X-ray transmitting window according to the present invention.
Figure 2B:
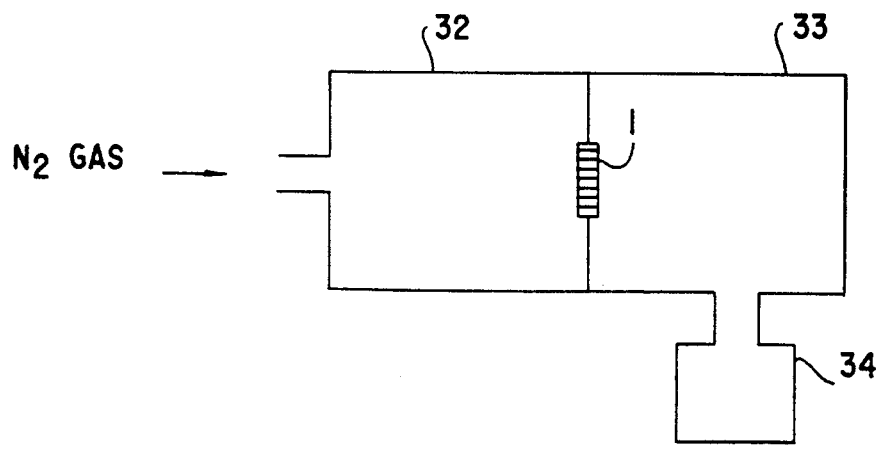
FIG. 2(b) is a cross-sectional view of a measuring system.

FIG. 2(a) is a graph illustrating the results of the measurements of a differential pressure obtained by various X-ray transmitting windows consisting of a plurality of thin tubes having difference inner diameters (D) and lengths (L). As shown in FIG. 2(b), two vessels 32 and 33 partitioned by the X-ray transmitting window 1 consisting of the plurality of thin tubes are coupled to each other. Pressure $p_1$ in the vessel 32 and pressure $P_2$ in the vessel 33 are measured while the vessel 33 is evacuated by a rotary pump 34 having a pumping speed of 500 liters/min. Combinations of the inner diameters (D) and the lengths (L) of the thin tubes 2 in the various windows 1 are shown in FIG. 2(a). The length (L) corresponds to the thickness of the window 1. Since these X-ray transmitting windows have the same diameter, they have different total numbers of thin tubes 2. The number of thin tubes 2 in the window is determined by the inner diameter (D) thereof. In these windows, the opening surface area ratio of all the thin tubes 2, i.e., the ratio of the total cross-sectional open surface area of all the thin tubes 2 to the area of the window 1, is a fixed value of 63%. The inner diameter (D) and total number (N) of the thin tubes 2 which form the windows 1 having the aforementioned opening surface area ratio and an effective diameter of 20 mm are as follows:

| D (μm) | N |
|---|---|
| 25 | $4 \times 10^5$ |
| 12 | $1.75 \times 10^6$ |
| 6 | $7 \times 10^6$ |

According to the kinetic theory of gases, the flow rate Q of the gas which flows through the tube having a conductance C and the pressures $P_1$ and $P_2$ at the two sides of the tube have the relationship expressed by the following equation:

$$Q = C(P_1 - P_2) \quad (1)$$

Figure 3:
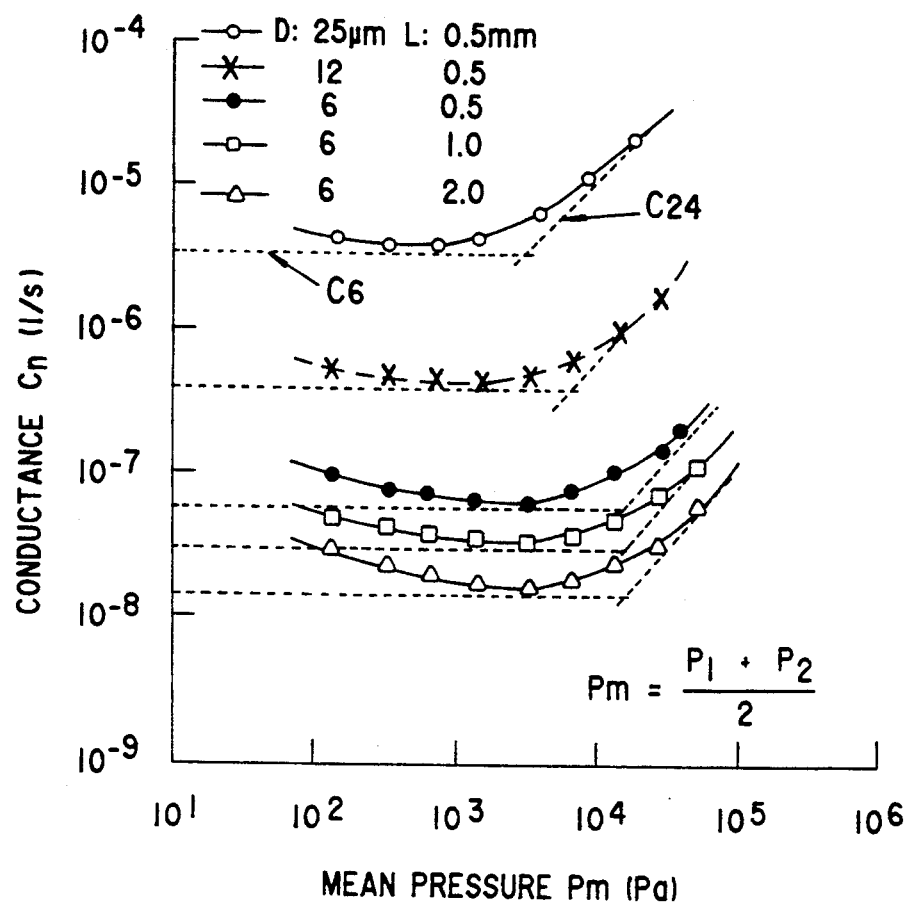
FIG. 3 is a graph showing the results of the analysis on a conductance of the thin tube which is the constituent of the X-ray transmitting window according to the present invention.

FIG. 3 is a graph in which conductance $C_n$ of gas through the thin tube 2 obtained from the results of FIG. 2(a) and from equation (1) is plotted relative to an average value $P_m$ of pressures $P_1$ and $P_2$, i.e., $P_m = (P_1 + P_2)/2$. Combinations of the inner diameters (D) and the lengths (L) of the thin tubes 2 are shown in FIG. 3. As shown in FIG. 3, in the region of a high average pressure $P_m$, as the pressure increases, the conductance $C_n$ increases. In the region of a low average pressure $P_m$, the conductance $C_n$ is not substantially affected by the pressure. These are explained by the kinetic theory of gases. That is, in the high-pressure region where the gas shows the property of a viscous flow, the conductance $C_n$ is in proportion to the average pressure $P_m$, as expressed by equation (2). In the low-pressure region where the gas shows the property of a molecular flow, the conductance $C_n$ is not dependent on the pressure, as expressed by equation (3). Conductances $C_6$ and $C_{24}$ in the viscous flow and molecular flow regions are expressed by:

$$C_{24} = 1349 \times (D^4/L) \times (P_1 + P_2)/2 \quad (2)$$

$$C_6 = 131 \times D^3/L \quad (3)$$

In FIG. 3, the theoretical curves corresponding to the equations (2) and (3) are shown by the broken line. The region between the viscous flow and molecular flow is a so-called intermediate region.

The general conductance of the X-ray transmitting window consisting of a bundle of n thin tubes each having the conductance $C_n$ is $nC_n$. Since the open surface area ratio of the thin tubes 2 in the various windows 1 employed in the above experiments is fixed, the total sum of the cross-sectional areas of the n thin tubes 2 is a fixed value of $n\pi D^2/4$. Expressing this constant by A, we have $$n = 4A/\pi D^2 \quad (4)$$

Thus, the general conductance $nC_n$ of the window 1 in the viscous flow region and the molecular flow region is expressed as follows:

$$nC_n = nC_{24} = k_1(D^2/L) \times (P_1 + P_2)/2 \quad (5)$$

$$nC_n = nC_6 = k_2 \times (D/L) \quad (6)$$

where $k_1$ and $k_2$ are constants.

It is apparent from equations (5) and (6) that the general conductance of the window 1 decreases in proportion to the square of the inner diameter (D) of the thin tube 2 in the viscous flow region and in proportion to the inner diameter (D) in the molecular flow region. Thus, in the windows 1 having the same open surface area ratio, the smaller the inner diameter (D) of the thin tube 2, the larger the pressure difference. This is shown in FIGS. 2(a) and 3. The inner diameter (D) and length (L) of the window tubes may be selected to provide gas conductance of $C_o$ such that total gas flow through the window is $G \geq nC_o$, so as to allow a desired pressure $P_2$ to be maintained in the vessel 33 by a pump having an evacuation rate G.

As mentioned above, the transmittance of Be having a thickness of 0.2 mm (200 μm) to 10 Å X-rays is about 0.0001. The transmittance of the X-ray transmitting window according to the present invention is equal to the opening surface ratio thereof. Therefore, even if it is estimated that the opening surface ratio of the thin tubes 2 in the window 1 is 50%, the transmittance of the X-ray transmitting window according to the present invention is 5000 times as high as the transmittance of the conventional one made of Be.

The mechanical strength of the X-ray transmitting window 1 according to the present invention was examined. The window 1 having dimensions of 30 mm×30 mm and a thickness of 1 mm was mounted, as a lid, on a pressure device. After the one surface of the window 1 was covered by an aluminum foil, compressed nitrogen gas was directed toward the aluminum foil. The window 1 broke when the pressure difference on the two surfaces thereof reached 2.8 atm. It can be inferred that such a rupture strength is proportional to the thickness of the window 1. This means that a window having a thickness of 0.5 mm and used in the experiments described in connection with FIG. 2 has a sufficient strength to the pressure difference of 1 atm.

Figure 4:
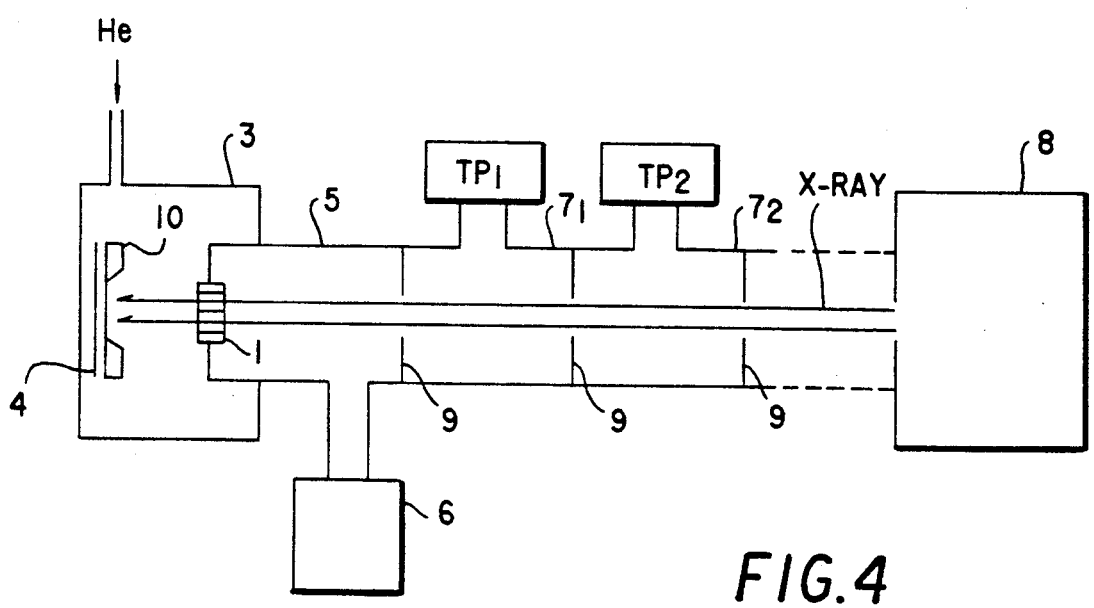
FIGS. 4 and are 5 schematic cross-sectional views illustrating examples of the structure of illuminating X-rays to which the X-ray transmitting window according to the present invention is applied.

When the X-ray transmitting window according to the present invention is employed, the pressure after the window is reduced to about 1/10th of the atmospheric pressure. Thus, it is necessary for the differential evacuating device, such as that shown in FIG. 4, to be provided between the high-vacuum X-ray source and the X-ray transmitting window. That is, the X-ray transmitting window 1 according to the present invention is provided between a vessel 3 where a sample (which may be a semiconductor wafer ) 4 to which X-rays are illuminated is accommodated and a final stage (having the highest pressure) 5 of the differential evacuating device. The vessel 3 is filled with helium (He) gas of, for example, 1 atm. Part of He passes through the window 1 into the final stage 5. He in the final stage 5 is evacuated by, for example, a rotary pump 6. Thus, He is constantly supplied into the vessel 3 so that the amount of He in the vessel 3 remains the same.

The final stage 5 of the differential evacuating device and the X-ray source 8 evacuated to produce a high vacuum are connected each other through a plurality of intermediate stages $7_1$, $7_2$, ... The intermediate stages $7_1$, $7_2$, ... are evacuated by, for example, turbo pumps $TP_1$, $TP_2$, ... of a high pumping speed, respectively. The final stage 5, the intermediate stages $7_1$, $7_2$, ... and the X-ray source 8 are separated from each other by partitioning walls 9 each of which has an orifice of 5 mm×20 mm. The orifices of the partitioning walls 9 and the X-ray transmitting window 1 are disposed on a straight line. How the X-ray source 8 evacuated to produce a vacuum of about $10^{-8}$ Pa is connected to the final stage 5 evacuated to produce a vacuum of about 1/10th of the atmospheric pressure has been described. Reference numeral 10 denotes an exposure mask.

A case in which an X-ray transmitting window made of a Be plate and having a thickness of about 10 μm is used in place of the X-ray transmitting window 1 according to the present invention will be considered. In that case, the pressure in the final stage 5 must be made substantially equal to the atmospheric pressure so as to prevent breakage of the Be window. To achieve this, the number of stages of the differential evacuating device provided between the final stage 5 and the intermediate stage $7_1$ must be increased. This increases the installation area of the X-ray illumination device and production cost thereof, and makes the practical use thereof difficult.

Figure 5:
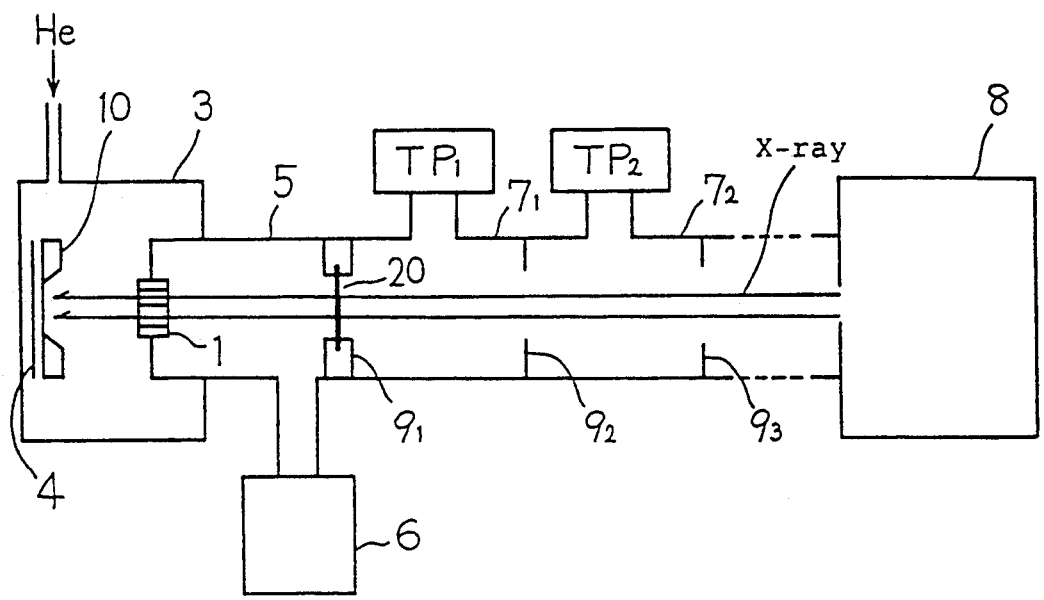

The aforementioned thin 10-μm thick Be window can be used without increasing the number of stages of the differential evacuating device if it is combined with the X-ray transmitting window according to the present invention. Such a structure will be described with reference to FIG. 5. An X-ray illuminating device shown in FIG. 5 has substantially the same structure as that of the device shown in FIG. 4 with the exception that a thin Be window 20 is provided at a position of an orifice $9_1$.

As mentioned above, the pressure of the final stage 5 of the differential evacuating device is 1/10th of the atmospheric pressure. Thus, the Be window 20 is enough to withstand a pressure different of about 1/10th of the conventional one. Under such conditions, a Be window 20 having dimensions of 30 mm×30 mm and a thickness of 10 μm can be used. This allows for the opening area of the orifices $9_2$, $9_3$... to be increased to 30 mm×30 mm. In such a structure, it is not necessary for the intermediate stages $7_1$, $7_2$, ... to serve as the differential evacuating device, and the structure can be simplified as compared with that shown in FIG. 4. In the structure shown in FIG. 5, the X-ray illumination area of the sample 4 can be increased as compared with that of the case which employs the conventional Be window, thus increasing the throughput of the X-ray lithography.

Figure 6:
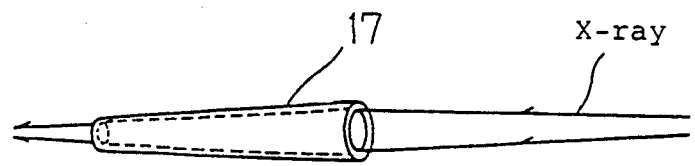
FIG. 6 is a perspective view of a tube for another embodiment of the X-ray transmitting window according to the present invention.

FIG. 6 illustrates another embodiment of the X-ray transmitting window according to the present invention. That is, in the X-ray transmitting window shown in FIG. 6 each of thin tubes 17 which constitute the X-ray transmitting window has an inner diameter which gradually decreases in one direction. In other words, the inner surface of the thin tube 17 is tapered. Normally, the X-rays reflected by a mirror provided in the X-ray source expands by about 6 milliradian (mrad) in the direction transverse to the direction of travel. Thus, the X-rays which pass through the thin tube 17 whose inner diameter increases toward the X-ray incident side are condensed as they are directed toward the emitting side thereof, and the illumination intensity of the X-rays is thus increased. If the inner surface of the thin tube 17 is coated by a reflecting material, such as platinum (Pt), the transmission efficiency of the window is enhanced, and the loss caused by the tapered thin tube 17 or variations in the degree of parallelization of the plurality of thin tubes 17 is reduced. Such a coating is also effective for protection of the window material.

The material of the X-ray transmitting window according to the present invention is not limited to those described in the above embodiments.

What is claimed is:

1. An X-ray exposure apparatus comprising:
   a first vessel for containing a sample to be exposed to an X-ray and means for providing thereto a gaseous atmosphere of a relatively higher pressure;
   a second vessel contiguous to said first vessel and maintained at a relatively lower pressure than said first vessel for operating an X-ray generating source connected thereto; and
   a window partitioning said first and second vessels, said window being composed of a plurality of juxtaposed substantially straight hollow thin tubes which are joined together in parallel to each other so as to form a plate member having a pair of parallel surfaces formed by end surfaces of said tubes, on which respective ends of said tubes open, whereby X-rays of said generating source may pass through an open surface area of said window from said second vessel to said first vessel, and said tubes of the window restrict flow of gas between said vessels to maintain the first and second vessels at the higher and lower relative pressures respectively.

2. An X-ray exposure apparatus according to claim 1, wherein said first vessel has a pressure $P_1$ and said second vessel has a pressure $P_2$ (where $P_1 > P_2$), said window is composed of a number n of thin tubes and each of said hollow thin tubes has an inner diameter D and a length L selected to provide gas conductance of $C_o$ such that gas flow through the window is $G \geq nC_o$, so as to allow the pressure of said second vessel evacuated by a pump having an evacuation rate G to be maintained to said pressure $P_2$ or below.

3. An X-ray exposure apparatus according to claim 1, wherein each of said joined thin tubes is formed to taper in such a manner that an inner diameter thereof gradually decreases in a direction from said second vessel to said first vessel, an inner surface of said thin tube being coated by a material having a high X-ray reflectance.

4. An X-ray exposure apparatus according to claim 1, wherein said window has side dimensions of several tens of millimeters and the open surface area ratio provided by said hollow thin tubes is substantially 63% of said window area.

5. An X-ray exposure apparatus according to claim 4, wherein said thin tubes have an inner diameter D of substantially 6 to 25 μm and a length L of substantially 0.5 mm to 2.0 mm, and said window has dimensions of substantially 30 mm × 30 mm.

* * * * *